United States Patent [19]
Bee

[11] Patent Number: 5,475,343
[45] Date of Patent: Dec. 12, 1995

[54] CLASS AB COMPLEMENTARY OUTPUT STAGE

[75] Inventor: Edward C. Bee, San Jose, Calif.

[73] Assignee: Elantec, Inc., Milpitas, Calif.

[21] Appl. No.: 290,362

[22] Filed: Aug. 15, 1994

[51] Int. Cl.$^6$ .................................................. H03F 3/26
[52] U.S. Cl. ........................................ 330/255; 330/267
[58] Field of Search ................................. 330/255, 263, 330/264, 267, 268

[56] References Cited

U.S. PATENT DOCUMENTS

| | | | |
|---|---|---|---|
| 5,113,148 | 5/1992 | Theus | 330/255 X |
| 5,363,059 | 11/1994 | Thiel | 330/255 X |

Primary Examiner—Steven Mottola
Attorney, Agent, or Firm—Leo V. Novakoski; Albert C. Smith

[57] ABSTRACT

A class AB complementary output stage provides maximum output voltage swings and high load currents with minimum power dissipation. The output stage includes a first bias circuit that generates a pair of voltage nodes with a resistor controlled bias current. A second bias circuit comprises four current sources the outputs of which are coupled pair-wise across a resistor to form a pair of high impedance nodes at the resistor terminals. The voltage nodes of the first bias circuit establish bias currents in a differential input stage and in a pair of current sources of the second bias circuit. The outputs of the differential input stage drive the inputs of second pair of current sources in the second bias circuit, which provide drive current to the high impedance nodes. The output circuit comprises a pair of complementary common source transistors, the gates (bases) of which are driven by the high impedance nodes of the second bias circuit.

14 Claims, 12 Drawing Sheets

CLASS AB COMPLEMENTARY OUTPUT STAGE

BACKGROUND OF THE INVENTION

1. Field of the Invention

The present invention relates to the field of amplifiers circuits and in particular to the field of low power, complementary output stages for amplifier circuits.

2. Related Art

Certain conventional amplifier circuits such as operational amplifiers and various CMOS amplifiers comprise differential input stages having active load gain stages and complementary output stages. An ideal complementary output stage should provide large voltage output swings and large output currents with low quiescent power dissipation. However, these features impose conflicting requirements, and available output stages include tradeoffs among power consumption, output voltage compliance, and output power.

For example, low power complementary output stages typically employ a class AB complementary source (emitter) follower configuration. In a complementary source (emitter) follower output stage, each transistor drives the load over only half the cycle, reducing the amount of quiescent current. The use of a complementary transistor pair increases the output voltage to approximately twice the value available from a single stage output circuit. However, the output voltage can only approach the supply voltage to within a gate-source (base-emitter) voltage drop. In addition, typical biasing schemes for the complementary source (emitter) follower transistors often do not provide sufficient voltages to the gates (bases) of the source (emitter) follower transistors, further limiting the output voltage.

Class A type output stages on the other hand provide high output power but at a cost of high quiescent power dissipation. In class A output stages, one transistor always remains fully turned on and the quiescent current must equal the maximum load current required. As with the complementary source (emitter) follower output stage, the output voltage and current may also be limited by the gate (base) voltage available to drive the output stage. There is thus a need for a complementary output stage capable of delivering high load currents and maximum output voltage swings with low quiescent power dissipation.

SUMMARY OF THE INVENTION

The present invention is a class AB, complementary output stage that operates in conjunction with a differential input stage to provide maximum output voltage swings and high load currents with minimum power dissipation. The output stage of the present invention includes a first bias circuit, a second bias circuit, and a complementary pair of common source (emitter) output transistors. A resistor-controlled bias current in the first bias circuit produces voltages at a pair of bias nodes, which in turn set quiescent currents in the differential input stage and the second bias circuit. The second bias circuit includes four current sources which are variously driven by the bias nodes and the outputs of the differential input stage to generate a pair of high impedance nodes and to provide driving current to the high impedance nodes in response to signals applied to the differential input stage. The high impedance nodes in turn provide gate (base) drive to the complementary pair of common source (emitter) transistors of the output circuit.

In a preferred embodiment of the output stage, the first bias circuit includes a complementary pair of diode connected common source (emitter) transistors, the drains (collectors) of which are coupled through a current setting resistor. The second bias circuit includes a current setting resistor that is connected between the current outputs of two current sources, to form a pair of high impedance voltage nodes at the current outputs. The current programming inputs of the first pair of current sources are coupled to at least one of the bias nodes so that the quiescent voltages at the high impedance nodes are simply related to the voltages at the bias nodes. The current outputs of a second pair of current sources are connected to the high impedance nodes, and the current programming inputs are connected to the outputs of the differential input stage. This second pair of current sources provides current to the high impedance nodes to drive the voltages at these nodes and, through them, the gates of the output transistors, in response a signal applied to the inputs of the differential amplifier input stage.

By including a pair of current sources specifically to drive the high impedance nodes of the second bias circuit, the complementary class AB output stage of the present invention can drive the gates (bases) of the complementary common source (emitter) output transistors to either supply voltage. This gate (base) drive coupled with the common source (emitter) configuration of the output transistors allows the output voltage to cover the full voltage range between the supply voltages. In addition, the quiescent current in the complementary output transistors is set by the voltages at the high impedance nodes, which can be precisely controlled by the first bias circuit through the resistor-controlled quiescent current in the second biasing circuit. For example, the size of the output transistors and the component transistors of the first and second bias circuits can be selected to establish the quiescent current in the output transistors at a value that is less than the maximum output current of the output stage. The four current sources of the second bias circuit can be driven by the first bias circuit and the differential amplifier input stage in various combinations, providing added flexibility to circuit designs that incorporate the complementary class AB output stage.

DETAILED DESCRIPTION OF THE PREFERRED EMBODIMENTS

Figure 1A:
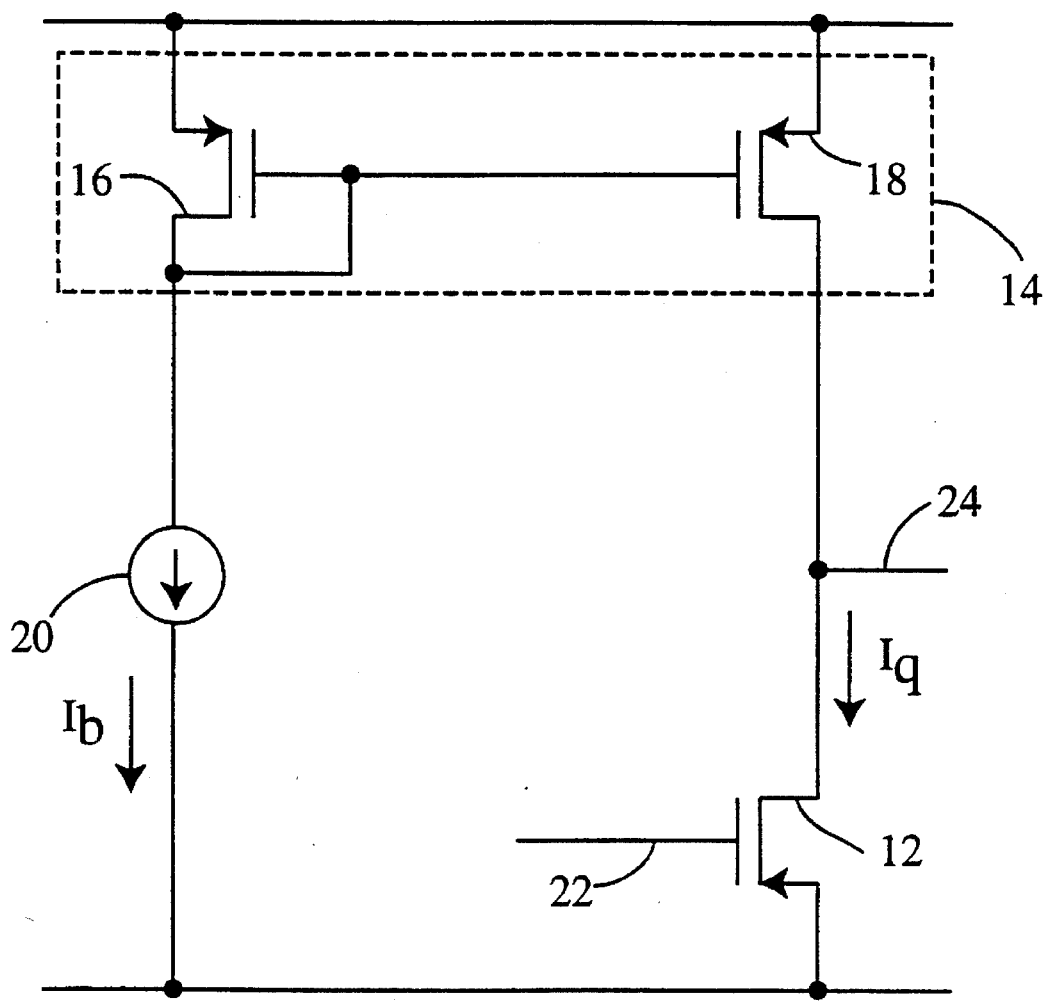
FIGS. 1A–1B are conventional class A and class AB complementary output stages, respectively.

Referring to FIG. 1A, there is shown a conventional class A output stage 10 including a common source output transistor 12 and a current mirror load 14 that comprises load transistors 16, 18. A current source 20 drives current mirror 14 with a bias current, $I_b$, which determines the quiescent current, $I_q$, in output transistor 12. Gate drive, which is provided by a preceding stage through input 22, is amplified at output 24 by the gain of output transistor 12. However, load transistor 18 provides no voltage gain, and $I_q$ must be sufficiently large to source current into the load for positive output voltages. Consequently, class A output stage 10 dissipates a substantial amount of quiescent power. Allowing $I_b$ to vary with the input signal gives output stage 10 class AB type behavior and lower power consumption. However, load transistor 18 still provides no significant gain.

Figure 1B:
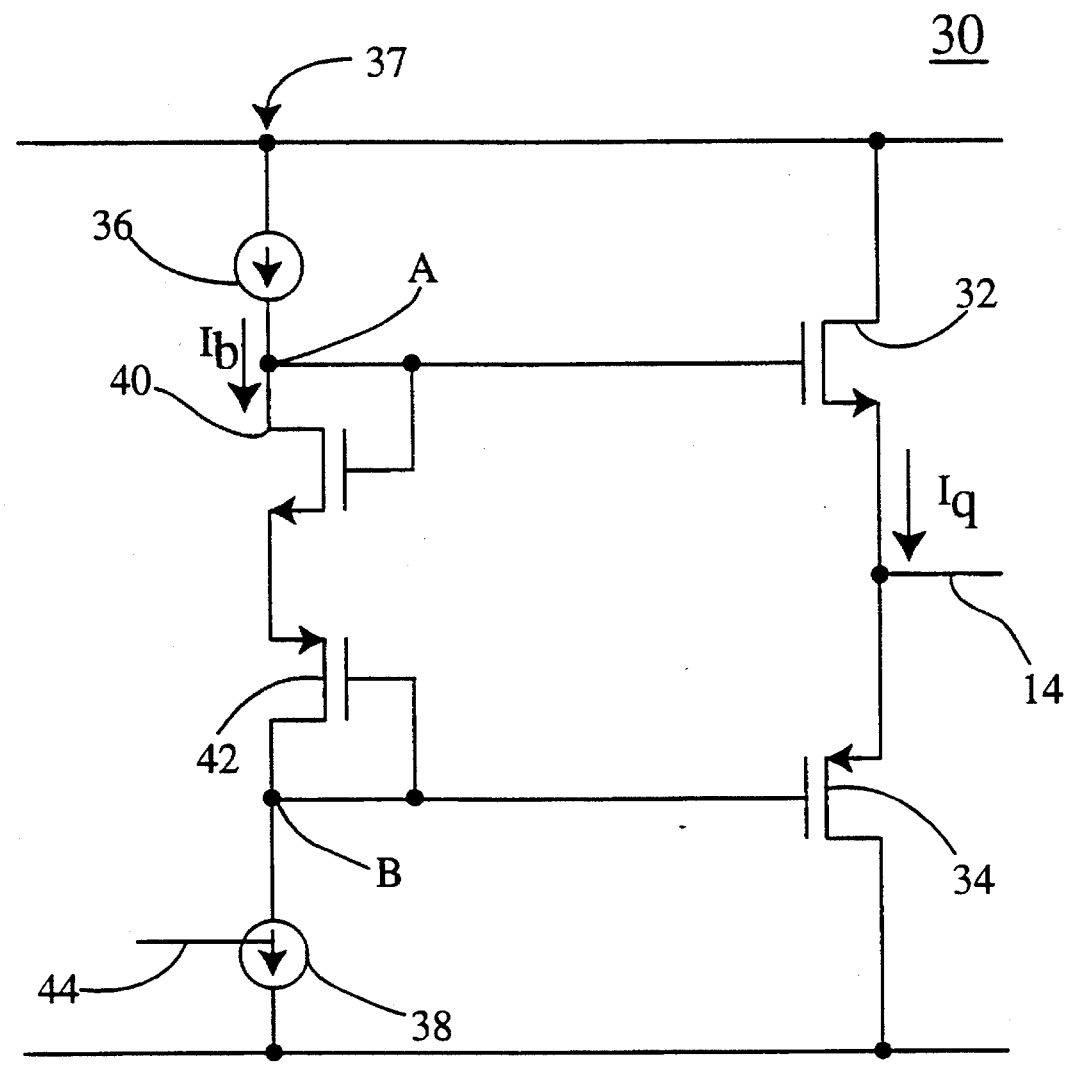

Referring now to FIG. 1B, there is shown a conventional class AB complementary source follower output stage 30 including first and second output transistors 32, 34 connected in series as source followers with respect to nodes A and B, respectively. A bias circuit 36 for output transistors 32, 34 includes diode-connected transistors 40, 42 and first and second current sources 36, 38. Circuit input 44 is formed by the current programming input of current source 38. Diode connected transistors 40, 42 limit cross-over distortion, and voltage nodes A, B formed at the drains of diode-connected transistors 40, 42 by bias current, $I_b$.

The voltage available at nodes A and B, to drive the gates of output transistors 32 and 34, respectively, is limited to less than half of the supply voltage, which in turn limits the output voltage. In addition, the quiescent current, $I_q$, flowing in output transistors 32, 34 is determined by $I_b$ and the ratio of the areas of diode connected transistors 40, 42 to the areas of output transistors 32, 34, respectively.

Figure 2A:
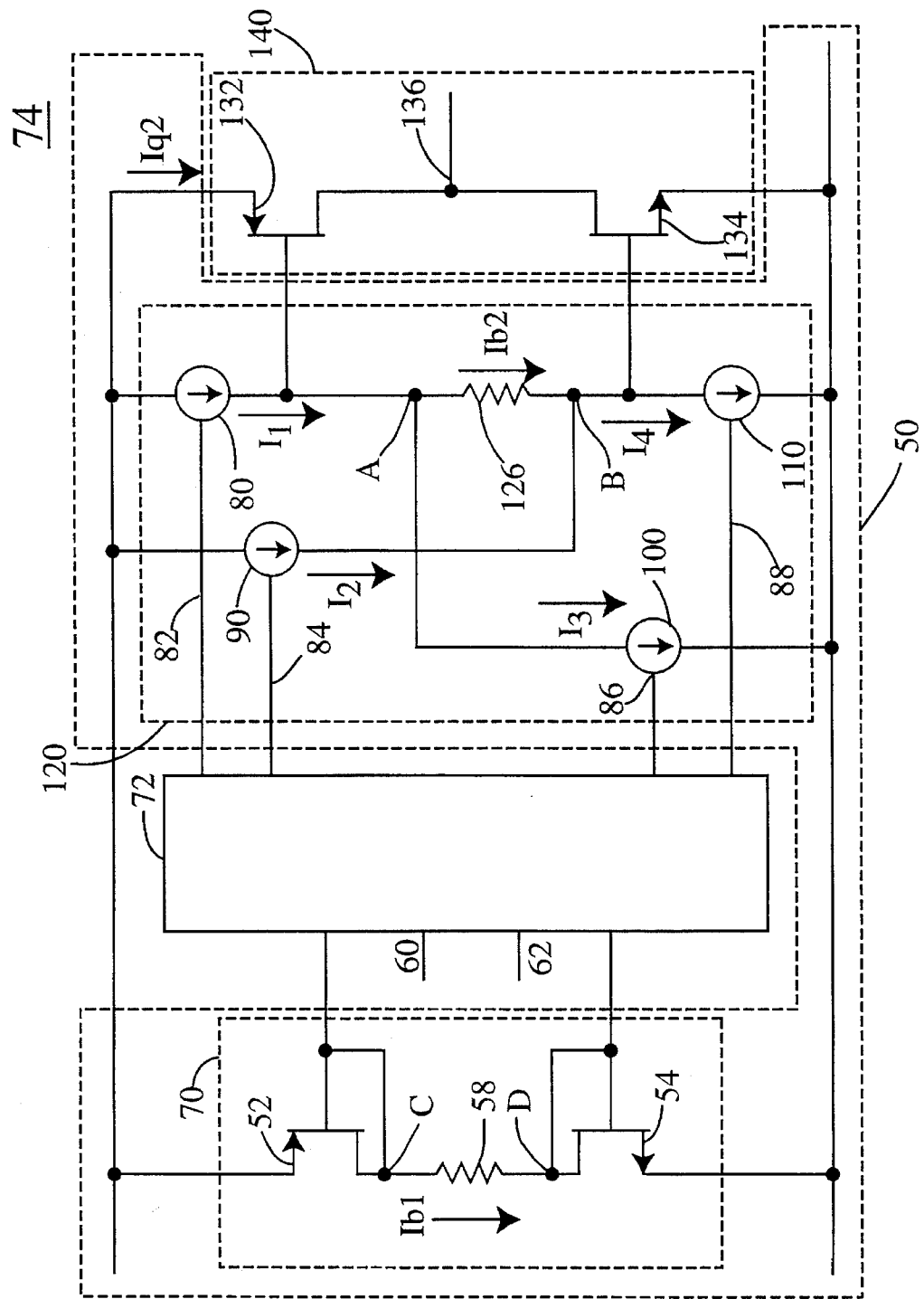
FIGS. 2A and 2B are a schematic representation of a class AB complementary output stages in accordance with the present invention.

Referring now to FIG. 2A, there is shown a schematic representation of a class AB complementary output stage 50 in accordance with the present invention, including a first bias circuit 70, a second bias circuit 120, and a complementary output circuit 140. Also shown is a differential input stage 72 which operates in conjunction with complementary output stage 50 to form a complete differential amplifier 74. Differential input stage 72 includes a pair of differential inputs 60, 62 and a pair of bias lines that couple it to first bias circuit 70. A pair of bias lines and a pair of differential outputs that couple differential input stage 72 to second bias circuit 120 are indicated only schematically, since the bias lines and differential outputs can be coupled to second bias circuit 120 in a variety of configurations, as discussed in detail below.

Figure 2B:
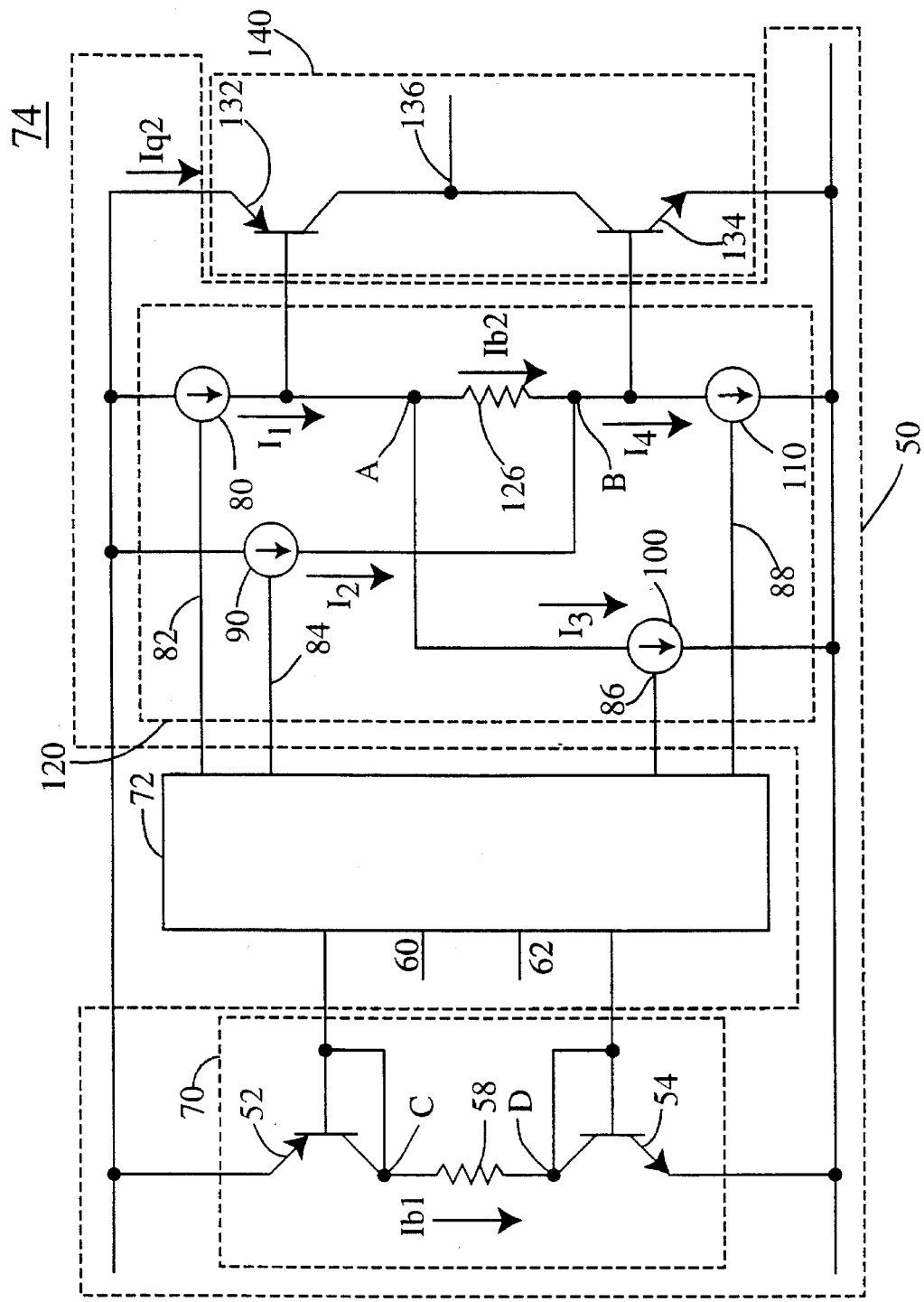

While complementary class AB output stage 50 is shown comprising FET transistors, it may also be realized using bipolar transistors, biCMOS transistors, or transistors based on any other semiconductor technologies. For example, FIG. 2B shows a class AB complementary output stage 50 in which bipolar transistors have replaced the FET transistors of FIG. 2A. In order to keep the discussion suitably general, therefore, the low impedance (source, emitter), control (gate, base) and high impedance (drain, collector) terminals of a transistor are referred to as the first, second, and third terminals, respectively, throughout the following discussion.

First bias circuit 70 includes a complementary pair of diode-connected bias transistors 52, 54 in which the second and third terminals of each of bias transistors 52 and 54 are connected together to form bias nodes C and D, respectively. The first terminals of diode-connected bias transistors 52, 54 are coupled to supply voltages, $V_+$ and $V_-$, respectively, and the third terminals are coupled to each other through a current-setting input bias resistor 58. A first bias current, $I_{b1}$, is determined by input bias resistor 58 and the W/L (width to length) ratios of diode-connected bias transistors 52, 54 and sets the voltages at bias nodes C, D.

Output circuit 140 includes complementary transistors 132, 134 which have their first terminals connected to voltage supplies, $V_+$, $V_-$, respectively, the third terminals connected to each other, and their second terminals connected to second bias circuit 120 at nodes A, B, respectively.

Second bias circuit 120 includes an output bias resistor 126, and first and second pairs of current sources 80, 100 and 90, 110, respectively, having current programming inputs 82, 86 and 84, 88, respectively. Current sources 80, 100 are connected in series with their current outputs connected to one terminal of output bias resistor 126 to form high impedance node A, and one of current programming inputs 82, 88 is coupled to one of bias nodes C, D. Similarly, current sources 90, 110 are connected in series with their current outputs connected to the other terminal of output resistor 126 to form a second high impedance node B, and one of current programming inputs 86, 88 is coupled to one of bias nodes C, D. Each of the remaining, two of current programming inputs 82, 84, 86, 88 is coupled to one of the outputs of differential input stage 72.

With this configuration for second bias circuit 120, a second bias current, $I_{b2}$, is generated in output bias resistor 126, which can be simply controlled by $I_{b1}$, through appropriate choices of the sizes of current sources 80, 90, 100, 110 and diode-connected transistors 52, 54. Second bias current, $I_{b2}$, is related to currents $I_1, I_2, I_3, I_4$, of current sources 80, 90, 100, 110 as follows:

$$I_{b2}=I_1-I_3=I_2$$

Different combinations of current sources 80, 90, 100, 110 can be connected to the outputs of differential amplifier 72 and bias nodes C, D, to achieve low power and high output voltage compliance for output stage 50. For example, one of current programming inputs 82, 84 may be connected to bias node C and one of current programming inputs 86, 88 may be coupled to bias node D with the remaining inputs coupled to outputs of differential amplifier 72. Alternatively, both of current programming inputs 82, 84 may be coupled to bias node C provided the coupling between the output of current source 90 and node C includes a suitable voltage offset. Similarly, both of current programming inputs 86, 88 may be coupled to bias node D provided a suitable voltage offset is provided between the output of current source 100 and bias node D.

The use of four current sources 80, 90 100, 110 in second bias circuit 120 rather than the one current source 20 or two current sources 36, 38 employed in conventional output stages 10, 30, respectively, enhances the performance of output stage 50 relative to these conventional circuits by allowing driving current to be provided directly to high impedance nodes A and B. Further, the drive current is controlled independently of the bias current $I_{b2}$ flowing in second bias circuit 120. By driving one current source from each of first and second pairs of current sources with an output of differential amplifier 72, voltages corresponding to substantially the full range of the supply voltages may be provided to the second terminals of output transistors 132, 134 in response to a signal at differential inputs 60, 62.

When no signal is applied to differential inputs 60, 62, all four current sources 80, 90 100, 110 provide bias current $I_{b2}$ according to the voltage at bias nodes C, D and the sizes of current sources 80, 90 100, 110. The resulting voltage difference between high impedance nodes A, B establishes a quiescent current, $I_{q2}$, in output transistors 132, 134 which is controlled by bias current, $I_{b1}$, in first bias circuit 70. In effect, this allows $I_{q2}$ to be determined by the relative sizes (W/L ratios) of transistors 52 and 132 and the relative sizes (W/L) of transistors 54 and 134.

Figure 3A:
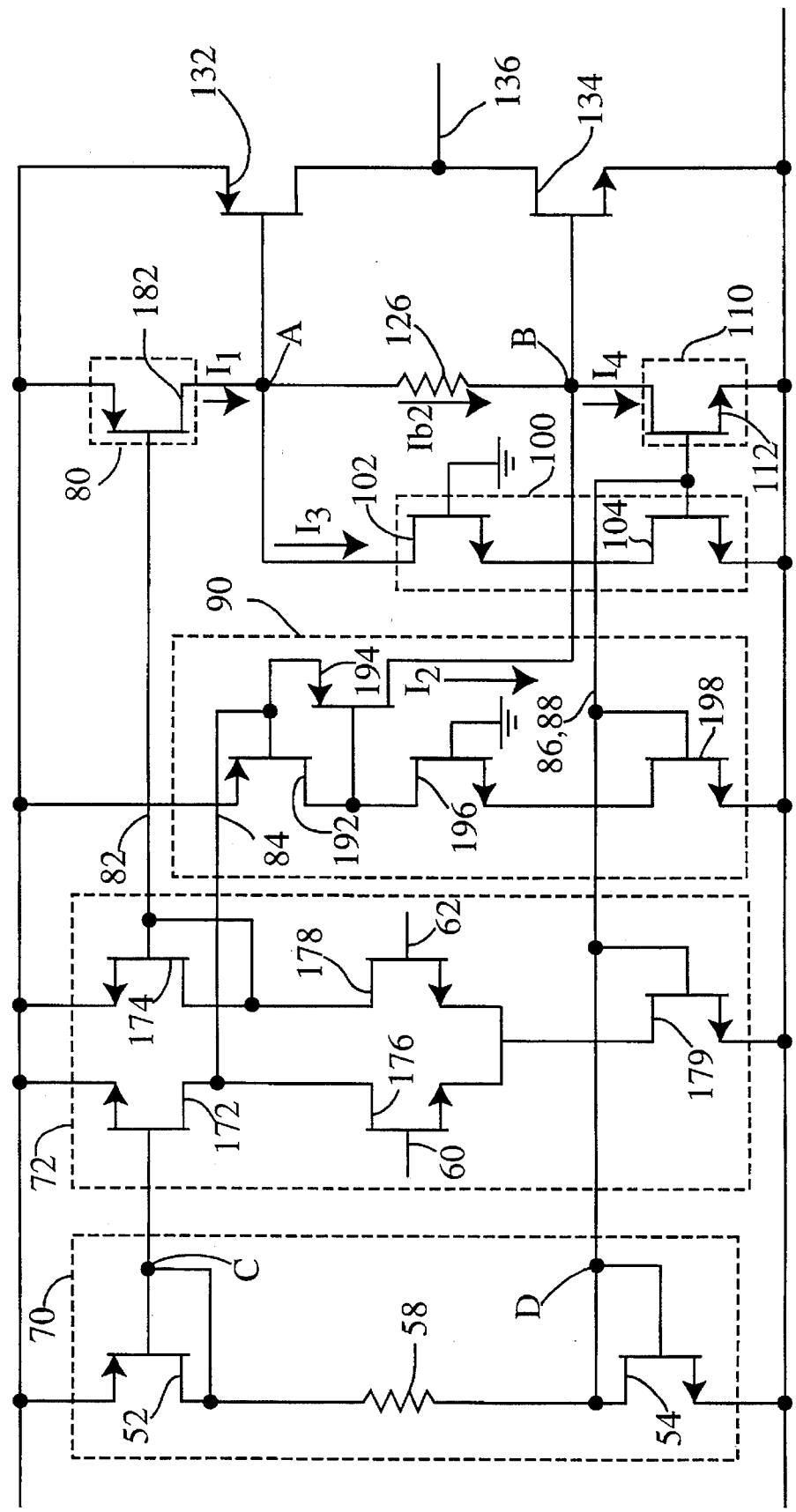
FIGS. 3A, 3B, 4A, 4B, 5A, 5B, 6A, and 6B various embodiments of a class AB complementary output stages in accordance with the present invention.
Figure 3B:
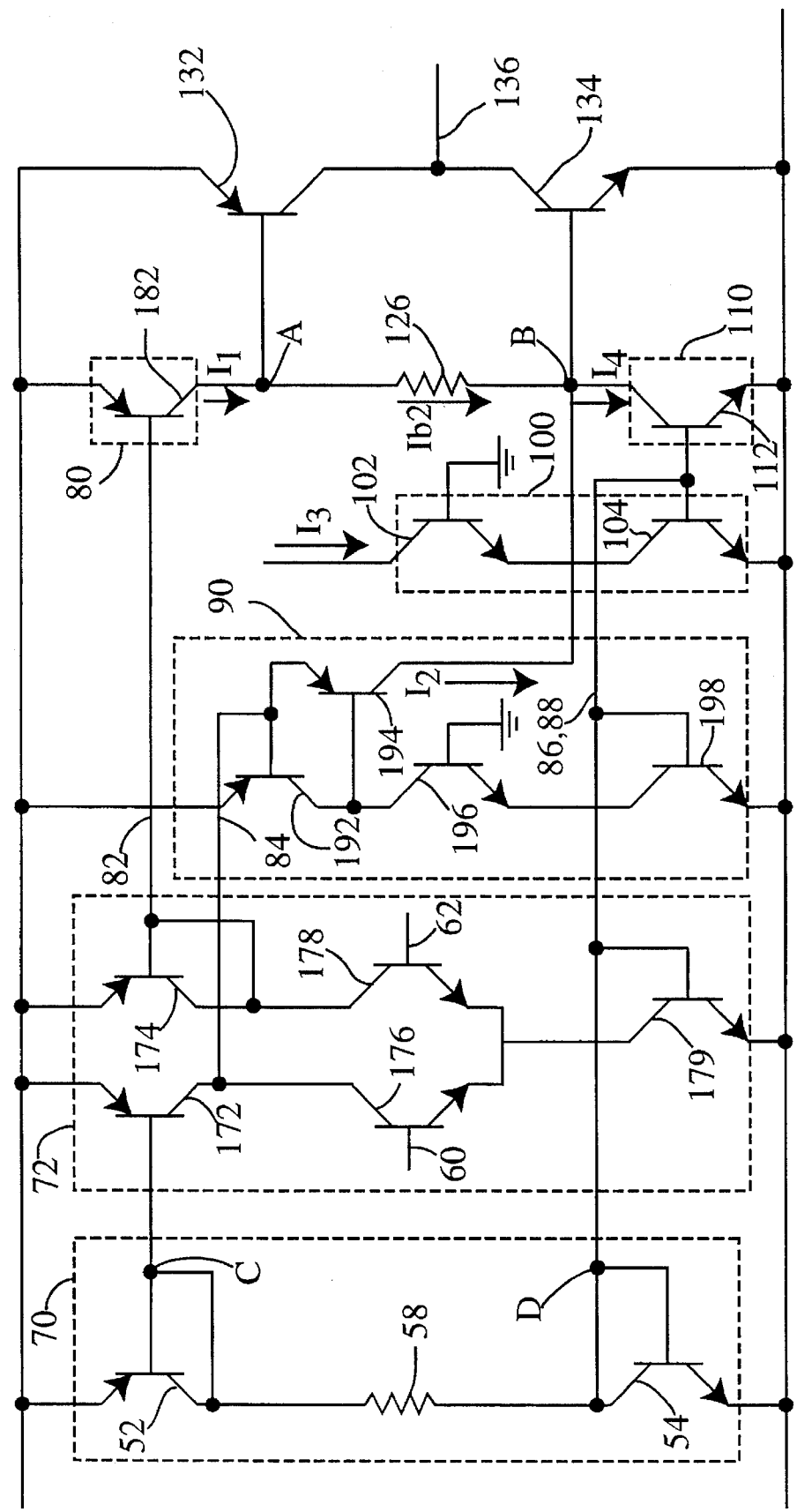

Referring now to FIGS. 3A, 3B, there are shown FET and bipolar embodiments, respectively, of class AB complementary output stage 50 and differential input stage 72. In each embodiment, current sources 100, 110 comprise n-type transistors 104, 112, respectively, with programming inputs 86, 88 coupled to bias node D. Transistor 102 provides a voltage offset between the third terminals of transistors 104, 102, establishing quiescent current $I_{b2}$ between high impedance nodes A and B. current programming inputs 82, 84 of current sources 80, 90, respectively, are driven by the outputs of differential amplifier input stage 72. Current source 80 comprises transistor 182 the second terminal of which forms current input 82 and is coupled to the second and third terminals of an active load transistor 174 on one output of differential amplifier 72. Current source 90 comprises transistors 192, 194 which are configured as a folded cascode, with the second terminal of transistor 192 forming current programming input 84 and the third terminal of transistor 194 forming the current output of current source 90. Current programming input 84 is driven from the third terminal of a second active load transistor 172 at the other output of differential amplifier 72. Bias node D provides a bias voltage to a current source transistor 198 of the folded casode formed by transistors 192, 194 and to a current source transistor 179 of differential input stage 72.

With no signal applied to inputs 60, 62 of differential amplifier input stage 72, the voltage drop across output bias resistor 126 is the same as the voltage drop across input bias resistor 58, and $I_{q2}$ is determined by the relative size of the W/L ratios of output transistor 132 and input bias transistor 52 and of output transistor 134 and input bias transistor 54. In a preferred embodiment of output stage 50, component transistors are selected so that the ratio of currents flowing in first bias circuit 70, differential input stage 72, second bias circuit 120, and output circuit 140 is 1:8:8:30. In this way, class AB complementary output stage 50 allows $I_{b2}$ and consequently $I_{q2}$ to be set by appropriate selection of bias resistors 58, 126, input transistors 52, 54, and output transistors 132, 134.

With the configuration shown in FIGS. 3A, 3B currents 13 and 14 of current sources 100, 110, respectively, are set by bias node D. Current sources 80, 90 are driven by the outputs of differential amplifier 72 so that the currents $I_1$, $I_2$ into high impedance nodes A and B increase or decrease in unison. By driving the voltages of high impedance nodes A, B with current sources 80, 90, voltage drive to the control terminals of output transistors 132, 134 can range between $V_+$ and $V_-$. In addition, since output transistors 132, 134 are configured as complementary common source (emitter) amplifiers, output terminal 136 can also swing over the full voltage range between the supply voltages.

Figure 4A:
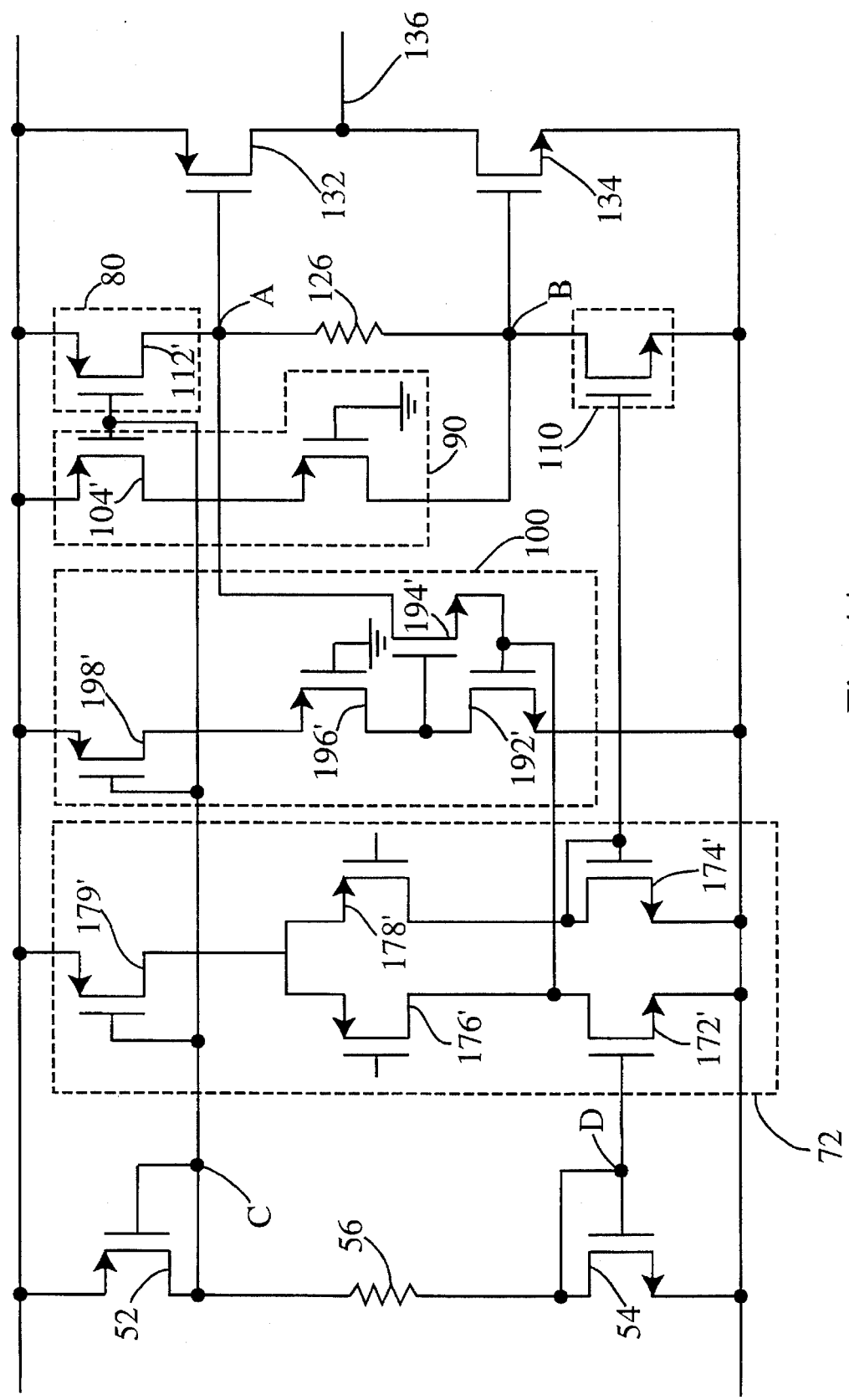
Figure 4B:
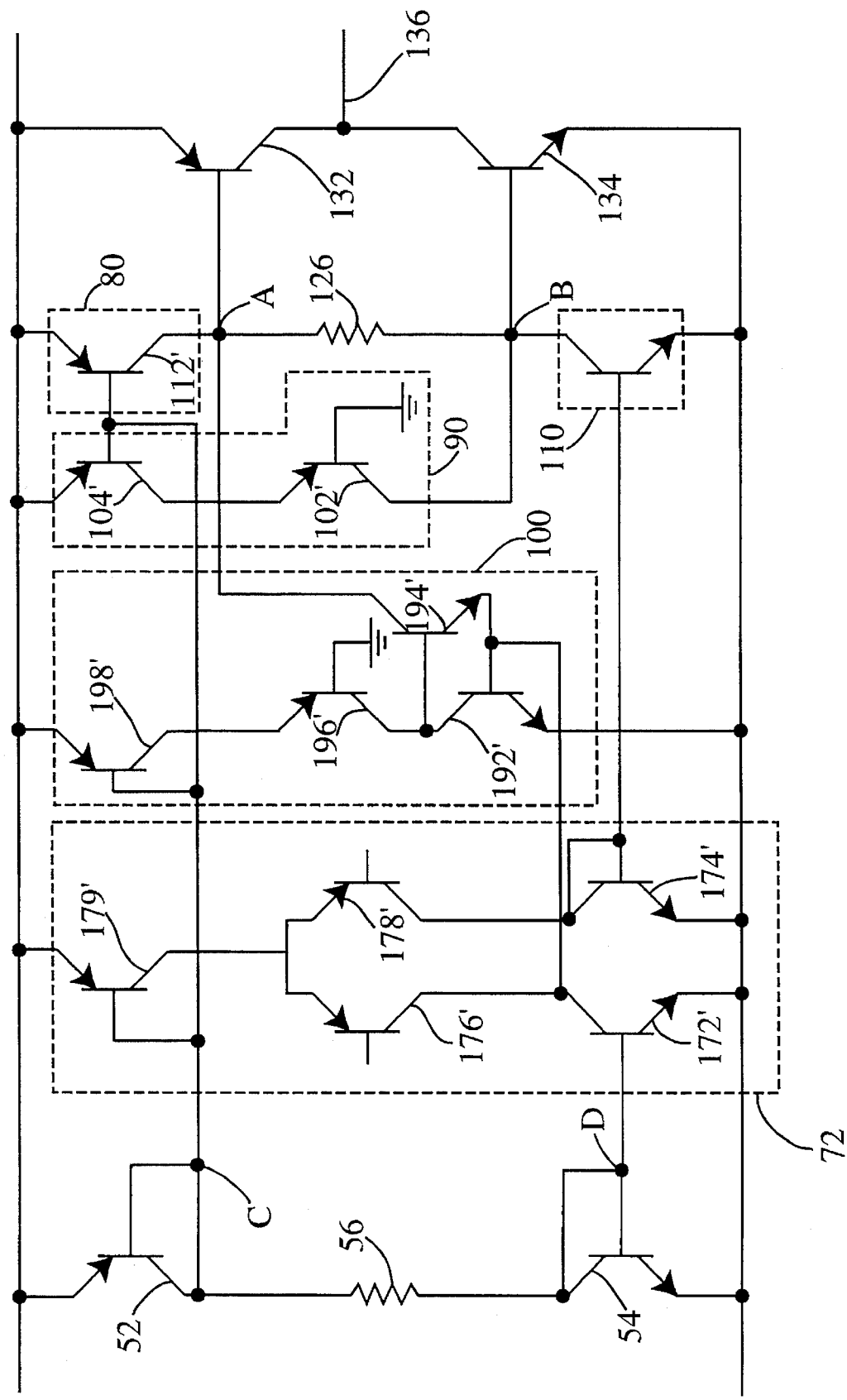

Referring now to FIGS. 4A, 4B there are shown FET and bipolar embodiments, respectively, of class AB complementary output stage 50 in which current sources 80, 90 are coupled to bias node C. Current sources 100, 110 are driven by opposite outputs of differential amplifier input stage 72. Output stages 50 of FIGS. 4A, 4B are essentially equivalent to output stages 50 of FIGS. 3A, 3B, respectively, with the conductivity types of component devices reversed.

Figure 5A:
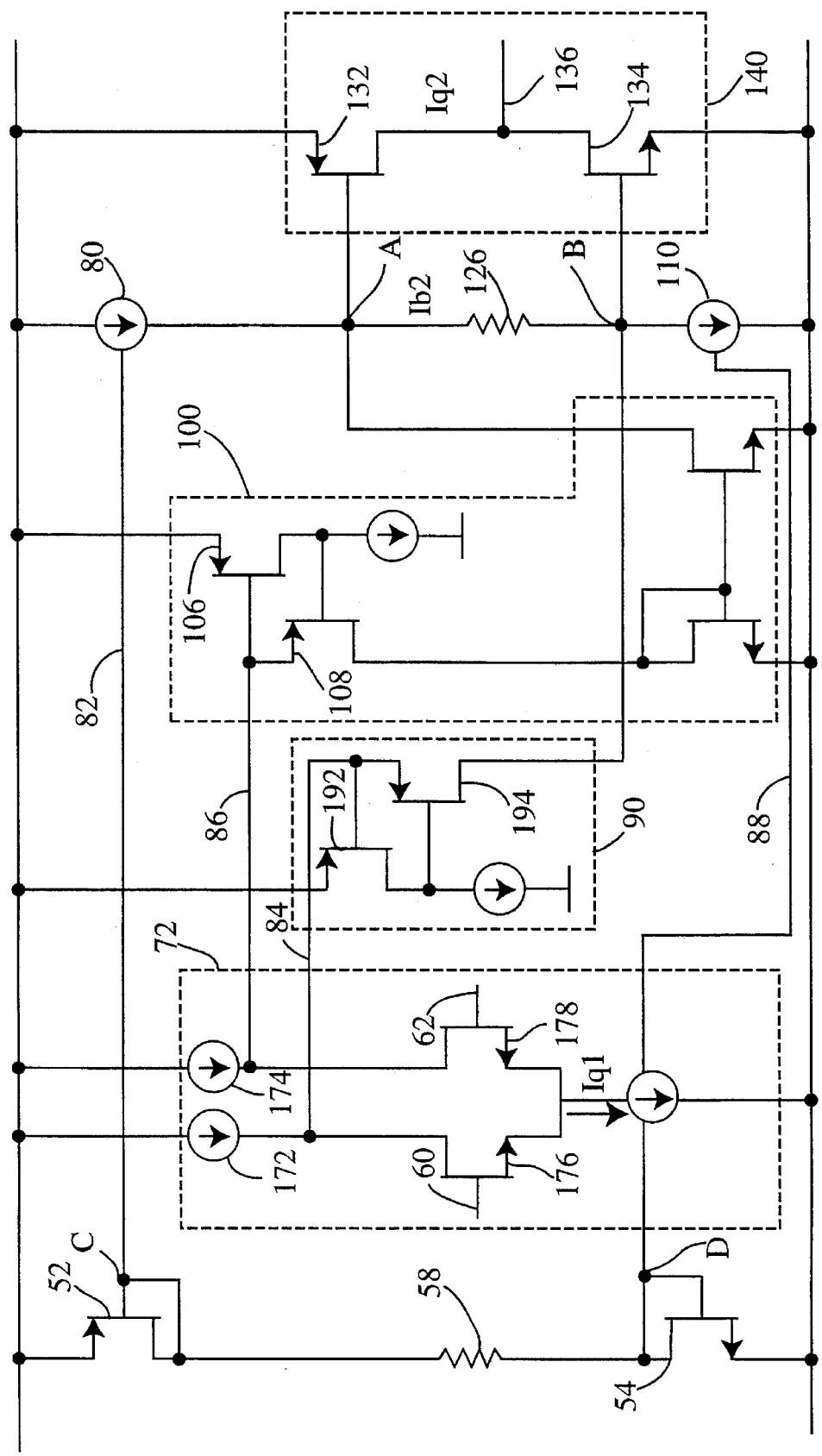
Figure 5B:
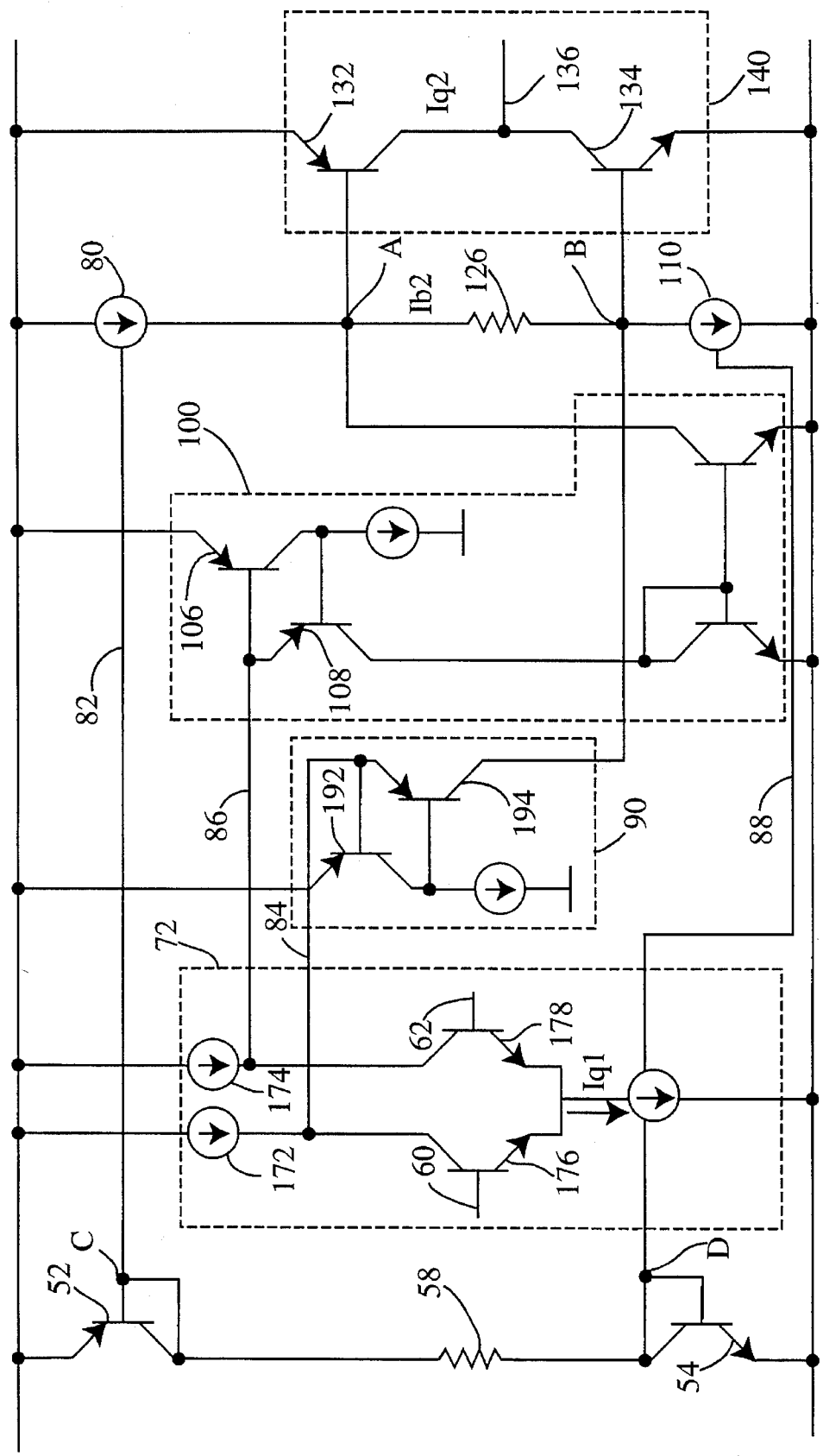

Referring now to FIGS. 5A, 5B, there are shown alternative embodiments of class AB complementary output stage 50. In the embodiments of FIGS. 5A, 5B current programming inputs 82, 88 of current sources 80, 110, respectively, are coupled to bias nodes C, D, respectively, and current programming inputs 84, 86 of current sources 90, 100 are coupled to different outputs of differential amplifier input stage 72. Current source 90 comprises transistors 192, 194, which are configured as a folded cascode, the input of which is coupled to the third terminal of differential input transistor 176. Similarly, current source 100 comprises transistors 106, 108, which are also configured as a folded cascode, the input of which is coupled to the third terminal of differential input transistor 178.

The quiescent current, $I_{q1}$, in differential amplifier input stage 72 is established by the voltage at bias node D through emitter current source 179. The quiescent current $I_{q2}$ in output circuit 140 is established by coupling the voltages at bias nodes C, D to current programming inputs 82, 88 of current sources 80, 110, respectively. The resulting bias current, $I_{b2}$, through output bias resistor 126 establishes biasing voltages at high impedance nodes A, B for the second terminals of output transistors 132, 134, respectively.

With this configuration, current sources 90, 100 drive high impedance nodes A, B, respectively, in unison to higher and lower voltages. For example, the net current into high impedance node A is the steady current input by current source 80 less the current sunk by current source 100 and the current through output bias resistor 126. Similarly, the net current into high impedance node B are the currents from current source 90 and output bias resistor 126 less the current sunk by current source 110. With the voltage at current programming inputs 82, 88 of current sources 80, 110 fixed by bias points C, D, respectively, the current into high impedance nodes A, B, and thus the voltage available to drive the second terminals of output transistors 132, 134, respectively, is determined by differential amplifier input stage 72 through current sources 90, 100.

Figure 6A:
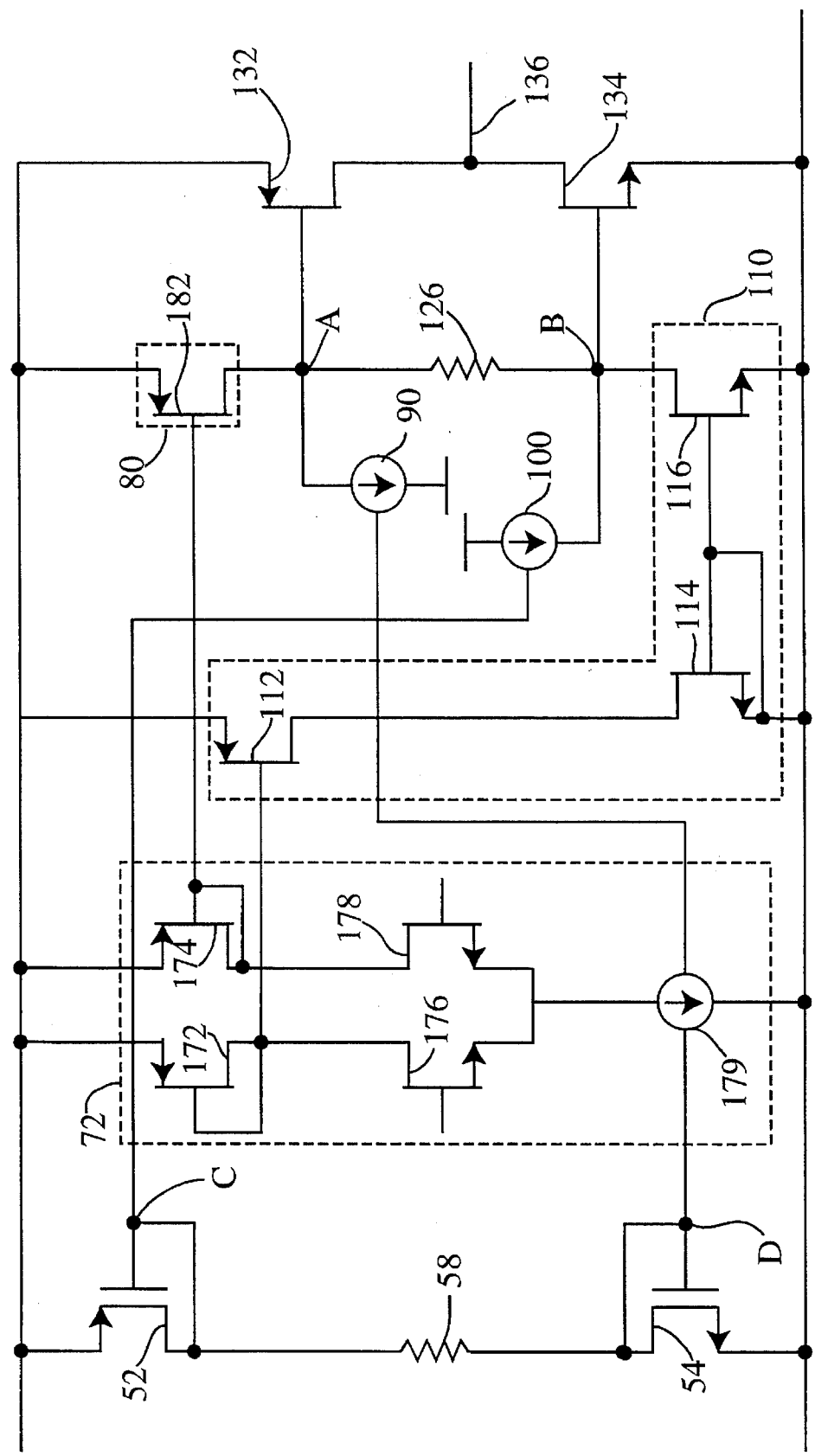
Figure 6B:
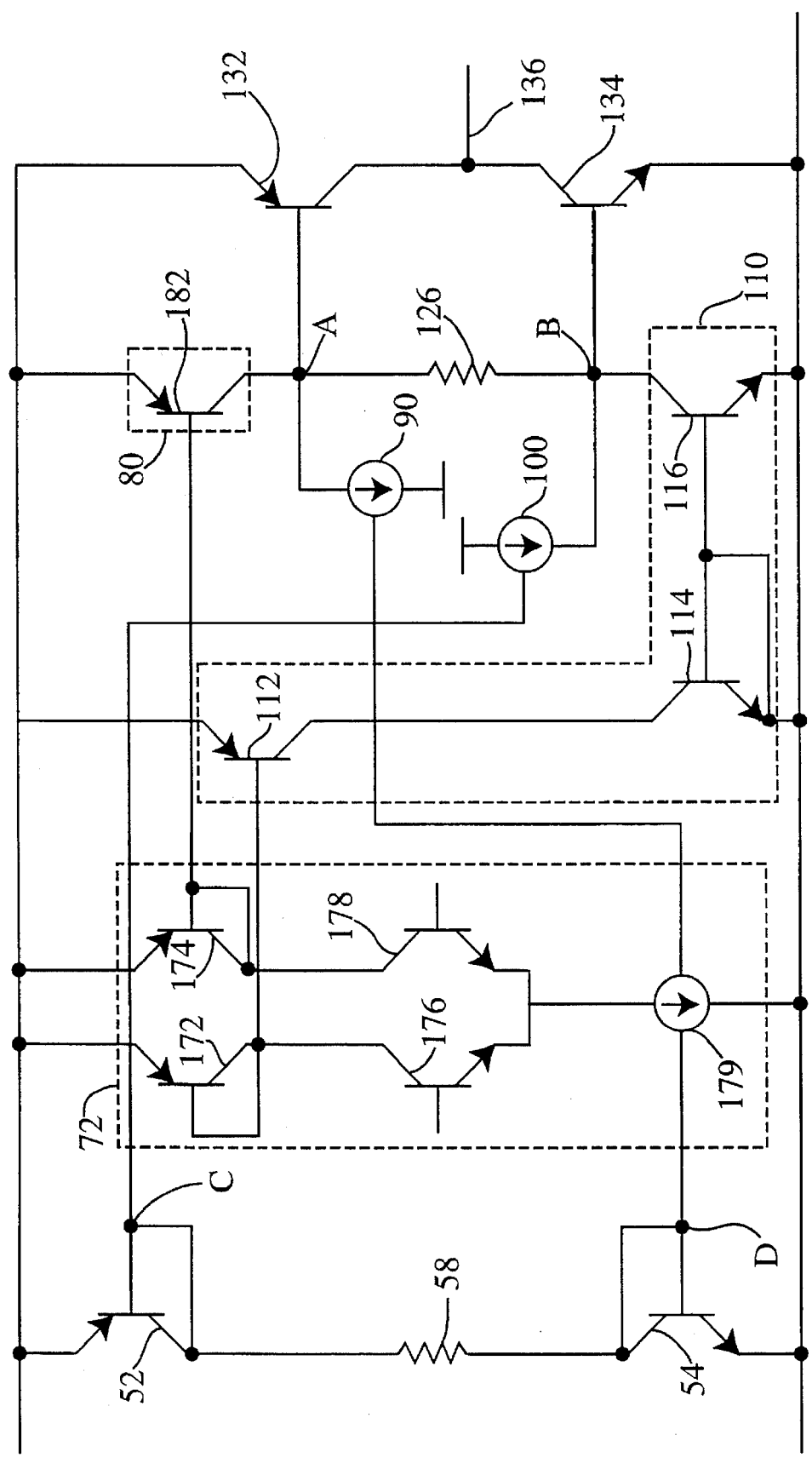

Referring now to FIGS. 6A, 6B, there are shown yet other embodiments of class AB complementary output stage 50. In this embodiment, current sources 80 and 110 are driven from the outputs of differential amplifier input stage 72 while current sources 90, 100 are coupled to bias nodes D,C respectively. Current source 80 is formed by transistor 182, the second terminal of which is coupled to one output of differential amplifier input stage 72. Current source 110 is formed by transistor 112 and current mirror transistors 114, 116 with the second terminal of transistor 112 coupled to the other output of differential amplifier input stage 72.

Therefore, a complementary class AB output stage is presented that provides improved output voltage compliance with lower power dissipation and well controlled quiescent currents. The output stage employs a first bias circuit to control quiescent currents in an output circuit through a second bias circuit, and in a differential input stage. The second bias circuit includes four current sources. A first pair of the current sources have their current programming inputs coupled to the first bias circuit to control the bias current in an output bias resistor, and second pair of the current sources have their current programming inputs coupled to the outputs of the differential input stage to provide current drive to high impedance nodes formed at the outputs of the first pair of current sources. The high impedance nodes are coupled to the gates (bases) of complementary output transistors, and can be driven to either reference voltage by the second pair of current sources. Four current sources of the second bias circuit can be driven by the bias nodes of the first bias circuit and the outputs of the differential input stage in a variety of configurations to provide.

I claim:

1. A class AB complementary output stage for a differential amplifier input stage having a pair of differential inputs, a pair of outputs with an active load coupled to each of the outputs, and a biasing current source, the output stage comprising:

first and second reference voltages;

an input bias resistor;

first and second bias transistors of opposite conductivity types, each having a first, second, and third electrode, the first electrodes of the first and second bias transistors being connected to the first and second reference voltages, respectively, and the second and third electrodes of each of the first and second bias transistor being connected together to form first and second bias nodes, respectively, that are coupled to each other through the input bias resistor to produce a first bias current, one of the first bias nodes being further coupled to the biasing current source of the differential amplifier to establish a quiescent current in the differential amplifier;

an output bias resistor;

first and second bias current sources, each having a current programming input and a current output, the current programming outputs of the first and second bias current sources being coupled to each other through the output bias resistor to form first and second high impedance nodes, respectively, and the current programming inputs of the first and second biasing current sources being coupled to at least one of the first and second bias nodes;

first and second driving current sources, each having a current programming input and a current output, the current programming inputs of each of the first and second driving current sources being coupled to one of the active loads at the outputs of the differential input stage and the current outputs of the first and second driving current sources being connected to the first and second high impedance nodes to provide driving current to the high impedance nodes in response to a differential signal applied to the inputs of the differential input stage;

first and second output transistors of complementary conductivity type, each output transistor having first, second, and third electrodes, the first electrodes of the first and second output transistor being coupled to the first and second reference voltages, respectively, the third electrodes of the output transistors being coupled together to form an output node, and the second electrodes of the first and second output transistors being connected to the first and second high impedance nodes, respectively, to provide an output voltage at the output node in response to a signal applied to the inputs of the differential input stage.

2. The class AB complementary output stage in accordance with claim 1, wherein the bias current sources are first and second bias current transistors having the same conductivity type, each having first, second, and third terminals, the first terminals being connected to the second reference voltage, the second terminals being connected to the second bias node, the third terminal of the first bias transistor being coupled to the first high impedance node, and the third terminal of the second bias transistor being connected to the second high impedance node.

3. The class AB complementary output stage of claim 2, wherein the voltage generating device is a transistor that is biased into conduction.

4. The class AB complementary output stage of claim 2, wherein the first driving current source is a current source transistor having a first, second, and third terminals, the first terminal being connected to the first reference voltage and the second and third terminals forming the current programming input and the current output, respectively, and wherein the second driving current source is a pair of transistors configured as a folded cascode having an input and an output, the input and output of the folded cascode forming the current programming input and the current output of the second driving current source.

5. The class AB complementary output stage of claim 4, wherein the bias transistors, the output transistors, the bias current transistors, the current source transistor, and the pair of transistors of the folded cascode are field effect transistors.

6. The class AB complementary output stage of claim 4, wherein the bias transistors, the output transistors, the bias current transistors, the current source transistor, and the pair of transistors of the folded cascode are bipolar transistors.

7. The class AB complementary output stage of claim 1, wherein the current programming inputs of the first and second bias current sources are coupled to the first and second bias nodes, respectively.

8. The class AB complementary output stage of claim 7, wherein the first driving current source comprises a pair of transistors configured as a folded cascode having an input and an output and a current mirror having a current mirror input and a current mirror output, the current mirror input being coupled to the output of the folded cascode, so that the input of the folded cascode and the current mirror output form the current programming input and current output of the first driving current source, respectively, and wherein the second driving current source comprises a pair of transistors configured as a folded cascode having an input and an output, the input and output of the folded cascode forming the current programming input and current output of the second driving current mirror.

9. The class AB complementary output stage of claim 7, wherein the bias transistors, the output transistors, and the pairs of transistors of configured as folded cascodes are field effect transistors.

10. The class AB complementary output stage of claim 7, wherein the bias transistors, the output transistors, and the pairs of transistors of configured as folded cascodes are bipolar transistors.

11. The class AB complementary output stage of claim 7, wherein the first and second driving current sources each comprise first and second driving current transistors, having first, second, and third terminals, the first terminals being coupled to the first reference voltage, the second terminals forming the current programming inputs of the first and second driving current sources, respectively, the third terminal of the first driving current transistor forming the current output of the first driving current source, the second driving current source further comprising a current mirror having a current mirror input and a current mirror output, the current mirror input being connected to the third terminal of the second driving current transistor and the current output forming the current output of the second driving current source.

12. The class AB complementary output stage of claim 11, wherein the bias transistors, the output transistors, and the driving current transistors are field effect transistors.

13. The class AB complementary output stage of claim 11, wherein the bias transistors, the output transistors, and the driving current transistors are bipolar transistors.

14. A class AB complementary output stage for a differential amplifier input stage having a pair of differential inputs, a pair of outputs with an active load coupled to each of the outputs, and a biasing current source, the output stage comprising:

first and second reference voltages;

a first bias circuit including a first bias resistor and complementary first and second bias transistors having first, second, and third terminals, the first and second bias transistors being configured as common first terminal transistors with respect to the first and second reference voltages respectively, the third terminals of the bias transistors being coupled together through the first bias resistor to form first and second bias nodes, and the second terminals of the first and second bias transistors being connected to the first and second bias nodes, respectively, one of the bias nodes being further connected to the current source of the differential input stage, for establishing a first bias current in the first bias resistor and a first quiescent current in the differential input stage, respectively;

a second bias circuit including a second bias resistor and first and second pairs of current sources, each current source having a current programming input and a current output, the current outputs of each current source of a pair being connected together to form first and second high impedance nodes with the first and second high impedance nodes being coupled through the second bias resistor, and the inputs from one current source of each pair of current sources being connected to at least one of the first and second bias nodes with the inputs of the remaining current source in each pair of current sources being coupled to the outputs of the differential amplifier input stage; and an output stage including first and second complementary output transistors having first, second, and third terminals, the complementary output transistors being configured as common first terminal transistors with respect to the first and second reference voltages respectively, and connected in series through their third terminals which form an output node, the second terminals of the first and second output transistors being connected to the first and second high impedance nodes, respectively, for providing output voltages at the output node in response to a signal applied to the inputs of the differential input stage.

* * * * *